United States Patent
Yun et al.

(10) Patent No.: US 7,755,403 B2
(45) Date of Patent: Jul. 13, 2010

(54) APPARATUS AND METHOD OF SETTING OPERATION MODE IN DLL CIRCUIT

(75) Inventors: Won-Joo Yun, Gyeonggi-do (KR);
Hyun-Woo Lee, Gyeonggi-do (KR);
Nak-Kyu Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 37 days.

(21) Appl. No.: 11/822,357

(22) Filed: Jul. 5, 2007

(65) Prior Publication Data

US 2008/0111600 A1 May 15, 2008

(30) Foreign Application Priority Data

Nov. 14, 2006 (KR) ............... 10-2006-0112303
Dec. 7, 2006 (KR) ............... 10-2006-0123567

(51) Int. Cl.
*H03L 7/06* (2006.01)
(52) U.S. Cl. ............... 327/158; 327/159; 327/149; 327/150
(58) Field of Classification Search ............... 327/141, 327/144–163; 331/1 A, 15–17; 375/373–376
See application file for complete search history.

(56) References Cited

U.S. PATENT DOCUMENTS

| 6,813,197 B2 | 11/2004 | Park |
| 6,989,700 B2 | 1/2006 | Kim |
| 7,154,311 B2 | 12/2006 | Lim |
| 7,170,313 B2 | 1/2007 | Shin |
| 2003/0053576 A1* | 3/2003 | Cao ............... 375/376 |
| 2006/0267649 A1 | 11/2006 | Park et al. |
| 2007/0069776 A1* | 3/2007 | Hur ............... 327/158 |
| 2007/0080701 A1* | 4/2007 | Kim et al. ............... 324/765 |

FOREIGN PATENT DOCUMENTS

| JP | 2003-032104 | 1/2003 |
| JP | 2005251370 | 9/2005 |
| KR | 1020020043782 | 6/2002 |
| KR | 1020030037675 | 5/2003 |
| KR | 1020040042427 | 5/2004 |
| KR | 1020040078510 | 9/2004 |
| KR | 1020050101878 | 10/2005 |
| KR | 1020060000568 | 1/2006 |
| KR | 1020060035836 | 4/2006 |

* cited by examiner

*Primary Examiner*—Lincoln Donovan
*Assistant Examiner*—Brandon S Cole
(74) *Attorney, Agent, or Firm*—Venable LLP; Jeffri A. Kaminski; Leigh D. Thelen (57) ABSTRACT

An apparatus for setting an operation mode in a DLL circuit generates a locking completion signal according to a level of a phase comparing signal obtained by comparing phases of a reference clock and a feedback clock. During three or more cycles of a pulse signal, it is determined whether a logic value of levels of the phase comparing signal is a specific combination, and the locking completion signal is selectively enabled.

32 Claims, 10 Drawing Sheets

APPARATUS AND METHOD OF SETTING OPERATION MODE IN DLL CIRCUIT

CROSS-REFERENCE TO RELATED PATENT APPLICATION

This application claims the benefit of Korean Patent Applications No. 10-2006-0112303 filed on Nov. 14, 2006 and No. 10-2006-0123567 filed on Dec. 7, 2006 in the Korean Intellectual Property Office, the disclosures of which are incorporated herein in their entirety by reference.

BACKGROUND OF THE INVENTION

1. Technical Field

The present invention relates to an apparatus and a method for setting an operation mode in a DLL (Delay Locked Loop) circuit, and more particularly, to an apparatus and a method for setting an operation mode in a DLL circuit that is capable of reducing an erroneous operation.

2. Related Art

In general, a DLL circuit is used to generate an internal clock whose phase is a predetermined time earlier than a phase of a reference clock that is obtained by converting an external clock. In a semiconductor integrated circuit, such as a synchronous DRAM (SDRAM), which has relatively high integration, an internal clock operates in a state where it is synchronized with an external clock.

Specifically, the external clock is input to a clock input buffer through an input pin of the semiconductor integrated circuit. The clock input buffer outputs the internal clock. At this time, the internal clock has a phase that is delayed a predetermined time more than a phase of the external clock by the clock input buffer. The phase of the internal clock is further delayed by delay elements that are included in the semiconductor integrated circuit, and is transmitted to a data output buffer. Then, the internal clock controls the data output buffer to output data.

Accordingly, there is a problem in that the output data is delayed by a large amount of time, as compared with the external clock. That is, a phase of the external clock is staggered with one of the output data.

In order to solve this problem, the DLL circuit is used. The DLL circuit adjusts the phase of the internal clock to be earlier by a predetermined time than the phase of the external clock. Therefore, the output data is output without a delay compared with the external clock. That is, the DLL circuit receives the external clock and generates the internal clock whose phase is a predetermined time earlier than the phase of the external clock.

In the DLL circuit according to the related art, a reference clock is generated from a clock input buffer. The DLL circuit includes a replica delayer that is obtained by replicating a delay time existing in a path through which the reference clock is transmitted to the data output buffer, and generates a feedback clock. Then, the DLL circuit compares phases of the reference clock and the feedback clock and generates a signal according to the compared result. A delay line delays the reference clock in order to synchronize the phases of the reference clock and the feedback clock with each other.

At this time, as a method of locking a clock that applies a delay time to the reference clock, a coarse locking mode and a fine locking mode are used. According to the coarse locking mode, a delay time is applied by a plurality of unit delayers that are included in a delay line. According to the fine locking mode, a clock is minutely delayed by using a phase mixer instead of the unit delayer. In order to perform these operations, the DLL circuit includes an apparatus for setting an operation mode. The apparatus for setting an operation mode receives a phase comparing signal from a phase comparator that compares phases of the reference clock and the feedback clock, outputs a locking completion signal to instruct a timing of when the coarse locking mode is completed, thereby controlling the operation of the delay line.

Figure 1:
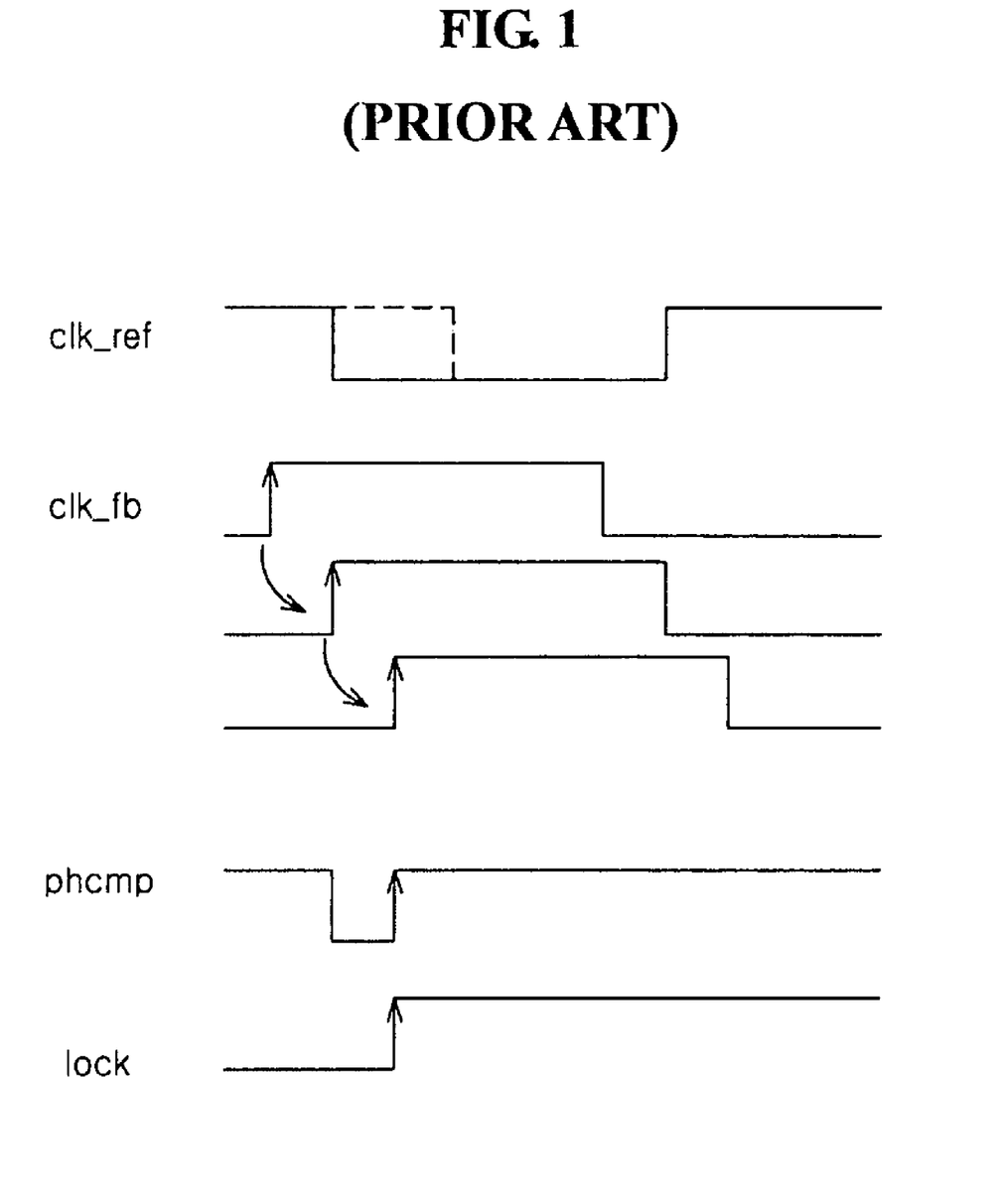
FIG. 1 is a timing diagram illustrating the operation of an apparatus for setting an operation mode in a DLL circuit according to the related art.

FIG. 1 is a timing diagram illustrating the operation of an apparatus for setting an operation mode in a DLL circuit according to the related art. FIG. 1 shows a state where a phase of a phase comparing signal phcmp is changed according to a phase of a reference clock clk_ref and a phase of a feedback clock clk_fb delayed per operation period of the DLL circuit. In FIG. 1, the case is exemplified in which when the operation of the DLL circuit starts, the phase of the reference clock clk_ref is earlier than the phase of the feedback clock clk_fb. Hereinafter, the operation period of the DLL circuit is an interval between the time that a delay line receives the reference clock and the time that the delay line receives a delay control signal. The delay control signal is obtained by comparing phases of the reference clock and the feedback clock. The operation period of the DLL circuit is continuous.

Preferably, if the level of the reference clock clk_ref is at a high level at a rising edge time of the feedback clock clk_fb, the level of the phase comparing signal phcmp is at a high level. Then, if the feedback clock clk_fb is delayed for each operation period of the DLL circuit, accordingly the level of the reference clock clk_ref is at a low level at the rising edge time of the feedback clock clk_fb and the level of the phase comparing signal phcmp becomes a low level. If the level of the reference clock clk_ref is at a high level at the rising edge time of the feedback clock clk_fb after the several operation periods of the DLL circuit, the phase comparing signal phcmp becomes a high level again. When the level of the phase comparing signal phcmp is increased from the low level to the high level, the locking completion signal lock is enabled.

However, as shown in FIG. 1, the pulse width of the reference clock clk_ref may be increased due to any reason.

In this case, if the level of the reference clock clk_ref is at a high level at the rising edge time of the feedback clock clk_fb, the phase comparing signal phcmp becomes a high-level. In addition, if the level of the reference clock clk_ref becomes a low level at a rising edge time of the feedback clock clk_fb at a next operation period of the DLL circuit, the level of the phase comparing signal phcmp is changed to the low level. However, if the pulse width of the reference clock clk_ref is increased during a next operation period of the DLL circuit, it is determined that the level of the reference clock clk_ref is at a high level again at the rising edge time of the feedback clock clk_fb, and the level of the phase comparing signal phcmp is changed to a high level. Accordingly, the locking completion signal lock is enabled as a high level, and the coarse locking mode operation is completed.

As such, if the level of the phase comparing signal phcmp is changed from the low level to the high level, the apparatus for setting an operation mode in a DLL circuit recognizes that the coarse locking mode is completed, and enables the locking completion signal lock as a high level. That is, even when the phase of the feedback clock clk_fb and the phase of the reference clock clk_ref are different from each other by a ½ cycle, the coarse locking mode may be completed due to the change in a pulse width of the reference clock clk_ref.

Actually, as described above, the change in the pulse width of the reference clock is an erroneous operation that often occurs in the DLL circuit. The pulse width may be changed not only in the reference clock but also in the feedback clock.

Further, an erroneous operation, such as a change in rising timing of the clock, often occurs. If the locking completion signal is enabled even when it is a predetermined timing, due to the erroneous operation, the semiconductor integrated circuit using the DLL circuit cannot perform the operation of synchronizing the clock and the data with each other.

SUMMARY OF THE INVENTION

Embodiments of the present invention provide an apparatus and a method for setting an operation mode in a DLL circuit that is capable of reducing an erroneous operation that occurs due to a change in a pulse width of a reference clock or a feedback clock.

An embodiment of the present invention provides an apparatus for setting an operation mode in a DLL circuit configured to generate a locking completion signal according to a level of a phase comparing signal obtained by comparing phases of a reference clock and a feedback clock, wherein during three or more cycles of a pulse signal, it is determined whether a logic value of levels of the phase comparing signal is a specific combination, and the locking completion signal is selectively enabled.

Another embodiment of the present invention provides an apparatus for setting an operation mode in a DLL circuit including: a reset unit configured to control a voltage level of a first node in response to a reset signal; a power supply unit configured to supply a voltage source to a second node in response to a locking completion signal and a pulse signal; a first control unit configured to determine whether a level of a phase comparing signal, which is input during at least three cycles of the pulse signal, is changed, thereby controlling a voltage level of the first node; a second control unit configured to control a voltage level of the second node in response to the phase comparing signal and the pulse signal; and a latch unit configured to latch a voltage applied at the first node, thereby outputting the locking completion signal.

Still another embodiment of the present invention provides an apparatus for setting an operation mode in a DLL circuit including: a reset unit configured to control a voltage level of a first node in response to a reset signal; a power supply unit configured to supply a voltage source to a second node in response to a locking completion signal and a pulse signal; a first control unit configured to include a first flip-flop latching a phase comparing signal according to control of the pulse signal and a second flip-flop latching an output signal of the first flip-flop according to the control of the pulse signal, and to change, when a logic value of levels of the phase comparing signal input to the first flip-flop is a specific combination, a voltage level of the first node; a second control unit configured to control a voltage level of the second node in response to the phase comparing signal and the pulse signal; and a latch unit configured to latch the voltage applied at the first node, thereby outputting the locking completion signal.

Yet another embodiment of the present invention provides an apparatus for setting an operation mode in a DLL circuit including: a reset unit configured to control a voltage level of a first node in response to a reset signal; a power supply unit configured to supply a voltage source to a second node in response to a locking completion signal and a pulse signal; a first control unit configured to control the voltage level of the first node in response to a phase comparing signal and the pulse signal; a second control unit configured to control the voltage level of a second node in response to the phase comparing signal and the pulse signal; an output control unit configured to compare a phase of a reference clock and a phase of a feedback clock, thereby generating an output control signal; and a latch unit configured to latch the voltage applied at the first node, thereby outputting the locking completion signal according to whether the output control signal is enabled or not.

A further embodiment of the present invention provides a method of setting an operation mode in a DLL circuit including: controlling a voltage level of a voltage applying node in response to a phase comparing signal, a pulse signal, and a locking completion signal; comparing a phase of a reference clock and a phase of a feedback clock, thereby generating an output control signal; and outputting a voltage applied at the voltage applying node as the locking completion signal according to control of the output control signal.

DESCRIPTION OF EXEMPLARY EMBODIMENTS

Embodiments of the present invention will now be described in detail with reference to the accompanying drawings.

Figure 2:
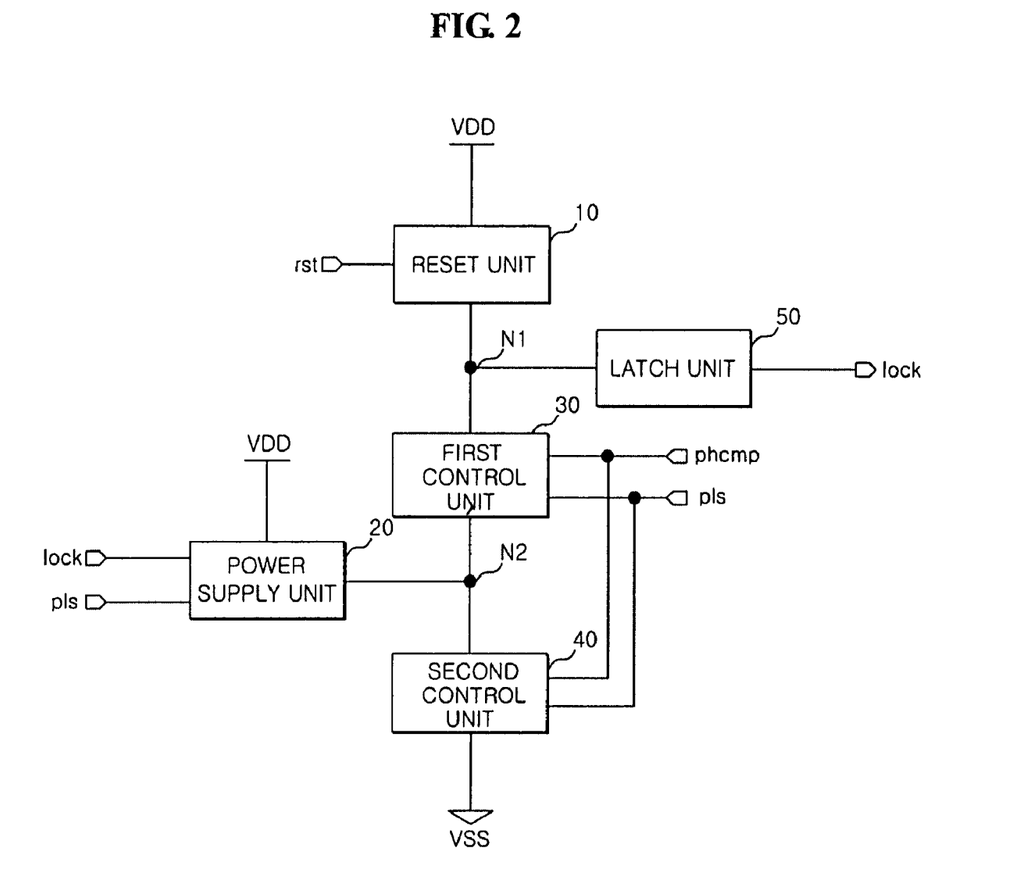
FIG. 2 is a block diagram illustrating a structure of an apparatus for setting an operation mode in a DLL circuit according to a first embodiment of the present invention.

Referring to FIG. 2, an apparatus for setting an operation mode in a DLL circuit according to a first embodiment of the present invention includes a reset unit 10, a power supply unit 20, a first control unit 30, a second control unit 40, and a latch unit 50.

The reset unit 10 controls a voltage level of a first node N1 in response to a reset signal rst.

The power supply unit 20 supplies a voltage source to a second node N2 in response to a locking completion signal lock and a pulse signal pls.

The first control unit 30 controls the voltage level of the first node N1 in response to a phase comparing signal phcmp and the pulse signal pls.

The second control unit 40 controls a voltage level of the second node N2 in response to the phase comparing signal phcmp and the pulse signal pls.

The latch unit 50 latches a voltage applied at the first node N1, thereby outputting the locking completion signal lock.

Here, the first control unit 30 changes a voltage level of the first node N1 when a logic value of the phase comparing signal phcmp, which is input during at least three cycles of the pulse signal pls, is a specific combination. That is, in the case where the phase comparing signal phcmp is changed to a high level from the low level after the phase comparing signal phcmp is maintained at a low level during two or more cycles of the pulse signal pls, the first control unit 30 changes the voltage level of the first node N1, thereby allowing the locking completion signal lock to be enabled.

Therefore, when an erroneous operation occurs, for example, a phase of a reference clock clk_ref or a feedback clock clk_fb is changed, the level of the phase comparing signal phcmp is temporarily changed and the first control unit 30 makes the locking completion signal lock not be enabled.

Figure 3:
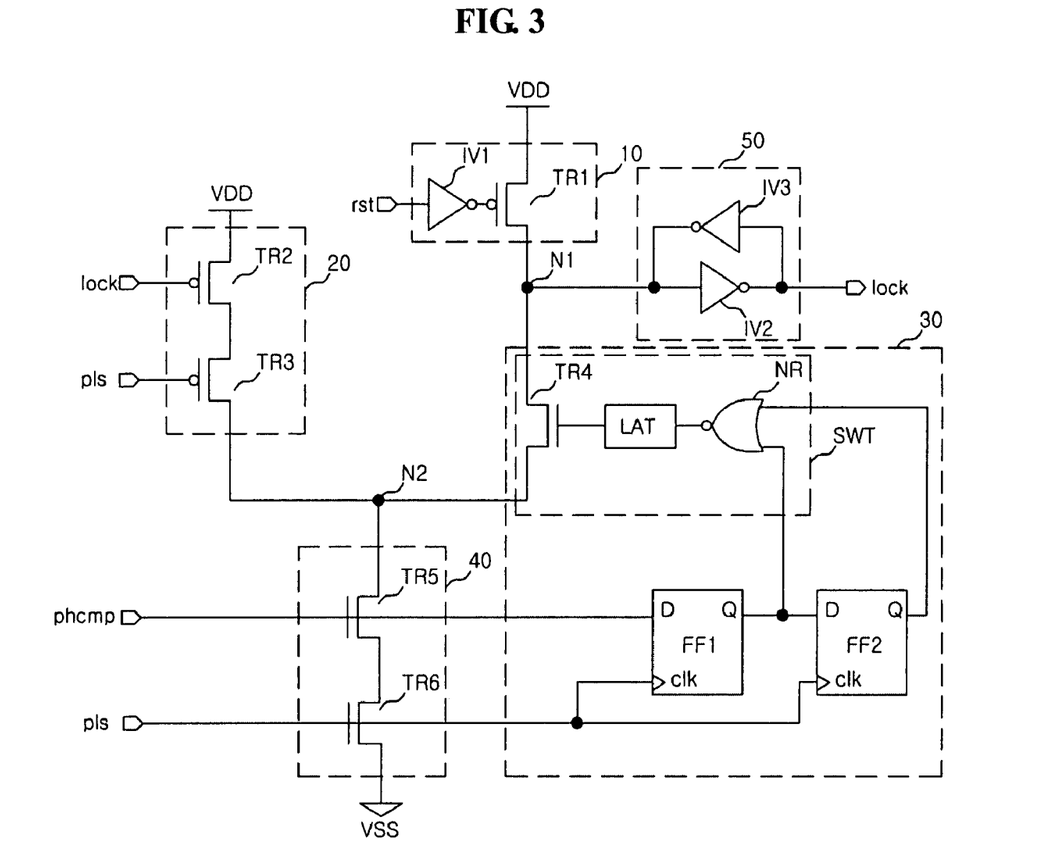
FIG. 3 is a circuit diagram illustrating a detailed structure of the apparatus for setting an operation mode shown in FIG. 2.

FIG. 3 is a diagram illustrating a detailed structure of the apparatus for setting an operation mode shown in FIG. 2.

As shown in FIG. 3, the reset unit 10 includes a first inverter IV1 that receives the reset signal rst and a first transistor TR1 that switches supplying to the first node N1 an external voltage source VDD in accordance with control of an output signal of the first inverter IV1.

The first transistor TR1 includes a gate terminal that receives the output signal of the first inverter IV1, a source terminal that is applied with the external voltage source VDD, and a drain terminal that is coupled with the first node N1.

The power supply unit 20 includes a second transistor TR2 that has a gate terminal receiving the locking completion signal lock and a source terminal applied with the external voltage source VDD, and a third transistor TR3 that has a gate terminal receiving the pulse signal pls, a source terminal coupled with a drain terminal of the second transistor TR2, and a drain terminal coupled with the second node N2.

The first control unit 30 includes a first flip-flop FF1, a second flip-flop FF2, and a switch SWT.

The first flip-flop FF1 latches the phase comparing signal phcmp according to control of the pulse signal pls.

The second flip-flop FF2 latches an output signal of the first flip-flop FF1 according to control of the pulse signal pls.

The switch SWT connects the first node N1 and the second node N2 when the output signals of the first and second flip-flops FF1 and FF2 are at a low level.

The switch SWT includes a NOR gate NR that receives the output signal of the first flip-flip FF1 and the output signal of the second flip-flop FF2, a latch LAT that latches an output signal of the NOR gate NR, and a fourth transistor TR4 that switches the first node N1 and the second node N2 according to control of an output signal of the latch LAT.

The fourth transistor TR4 includes a gate terminal that receives the output signal of the latch LAT, a drain terminal coupled with the first node N1, and a source terminal coupled with the second node N2.

The second control unit 40 includes a fifth transistor TR5 that has a gate terminal receiving the phase comparing signal phcmp, and a drain terminal coupled with the second node N2, and a sixth transistor TR6 that has a gate terminal receiving the pulse signal pls, a drain terminal coupled with a source terminal of the fifth transistor TR5, and a source terminal coupled with a ground.

The latch unit 50 includes a second inverter IV2 that receives a voltage applied at the first node N1 and outputs the locking completion signal lock, and a third inverter IV3 that forms a latch structure with the second inverter IV2.

Figure 4:
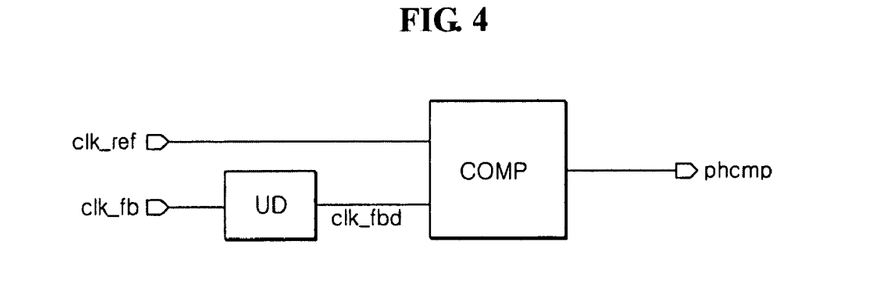
FIG. 4 is a block diagram illustrating a phase comparing signal shown in FIGS. 2 and 3.

Referring to FIG. 4, the phase comparing signal phcmp is a signal that indicates by levels, information which is obtained by comparing a phase of a delayed feedback clock clk_fbd having passed through one unit delayer UD and a phase of a reference clock clk_ref by using a phase comparator COMP and determining whether a phase of the reference clock clk_ref is earlier or later than a phase of the delayed feedback clock clk_fbd. When the phase of the delayed feedback clock clk_fbd is earlier than the phase of the reference clock clk_ref, the level of the phase comparing signal phcmp becomes a low level, and when the phase of the reference clock clk_ref is earlier than the phase of the delayed feedback clock clk_fbd, the level of the phase comparing signal phcmp becomes a high level. The unit delayer UD delays the feedback clock clk_fb by a delay time that corresponds to a delay amount applied to the feedback clock clk_fb according to the operation during one period of the DLL circuit. This is to compare the phases of the feedback clock clk_fb and the reference clock clk_ref in advance by one period of the DLL circuit, and to enable, when the phase difference between two clocks becomes smaller than a delay amount by one unit delayer UD, the locking completion signal lock so as to enter a fine locking mode.

The pulse signal pls is generated in the DLL circuit. Generally, the pulse signal pls has a pulse width that corresponds to one cycle of an internal clock, and is implemented in such a manner that it toggles to a high level once for predetermined cycles of the internal clock, for example, fifteen cycles.

When the operation of the DLL circuit starts, the reset signal rst is enabled, and the reset unit 10 makes the voltage level of the first node N1 become a high level.

At this time, the locking completion signal lock is at a low level. It is assumed that at the time of an initial operation of the DLL circuit, the second node N2 is at a high level by the power supply unit 20.

In a state where the phase of the delayed feedback clock clk_fbd is earlier than the phase of the reference clock clk_ref, the phase comparing signal phcmp becomes a low level. Accordingly, at this time, if the pulse signal pls is enabled, the phase comparing signal phcmp of the low level is input to the first flip-flop FF1 of the first control unit 30. Hereinafter, if the level of the phase comparing signal phcmp is at a low level even after one operation period of the DLL circuit, the low-level signal that is output by the first flip-flop FF1 is input to the second flip-flop FF2, and the phase comparing signal phcmp of the low-level is input to the first flip-flop FF1 again. The NOR gate NR receives the low-level signals and outputs a high-level signal. After the high-level signal that is output by the NOR gate NR is latched by the latch LAT, the high-level signal is transmitted to the gate terminal of the fourth transistor TR4, and turns on the fourth transistor TR4. At this time, since the fifth transistor TR5 of the second control unit 40 is turned off, the voltage level of the first node N1 and the voltage level of the second node N2 are maintained at a high level.

Then, if the phase of the reference clock clk_ref becomes earlier than the phase of the delayed feedback clock clk_fbd, the level of the phase comparing signal phcmp is changed to a high level. In this case, if the pulse signal pls is enabled, the fifth transistor TR5 and the sixth transistor TR6 of the second control unit 40 are turned on, and the level of the second node N2 becomes a low level. At this time, since the fourth transistor TR4 of the first control unit 30 is in a turned-on state, the potential level of the first node N1 also becomes a low level. Meanwhile, the output signal of the first flip-flop FF1 of the first control unit 30 becomes a high level, and the output signal of the second flip-flop FF2 becomes a low level. Accordingly, the output signal of the NOR gate NR becomes a low level, and the fourth transistor TR4 is turned off. Thus, the first node N1 and the second node N2 become disconnected from each other. As a result, the voltage level of the first node N1 is maintained at a low level, and the locking completion signal lock is enabled as a high level.

In general, since the pulse width of the reference clock or the feedback clock is not constant for each period of the DLL circuit, the level of the phase comparing signal phcmp is changed from a high level to a low level, and is then changed from a low level to a high level. As a result, the locking completion signal lock is enabled at an inaccurate timing.

Meanwhile, according to an embodiment of the present invention, even in the above-described case, the first control unit 30 can prevent erroneous operations from occurring. That is, when the pulse signal pls is enabled, if the phase comparing signal phcmp of the high level is input to the first flip-flop FF1 of the first control unit 30, and then the phase comparing signal phcmp of the low level is input to the first flip-flop FF1 during a next enable time of the pulse signal pls, the high-level signal and the low-level signal are input to the NOR gate NR, and as a result, the output signal of the NOR gate NR becomes a low level. Accordingly, at this time, the fourth transistor TR4 is not turned on.

Further, if the phase comparing signal phcmp of the high level is input to the first flip-flop FF1 during an enable period subsequent to the next enable period of the pulse signal pls, the low-level signal and the high-level signal are input to the NOR gate NR. Therefore, the level of the output signal of the NOR gate NR is maintained at a low level, and the fourth transistor TR4 is turned off.

As described above, when the level of the phase comparing signal phcmp is changed to a high level after the level of the phase comparing signal phcmp is maintained at a low level during two or more cycles of the pulse signal pls, the apparatus for setting an operation mode in a DLL circuit according to an embodiment of the present invention only enables the locking completion signal lock. That is, when the phase comparing signal phcmp is input to the first control unit 30 in a state where the level of the phase comprising signal phcmp has a specific combination during three cycles of the pulse signal pls, the voltage level of the first node N1 is changed. Therefore, it is possible to prevent the phase comparing signal phcmp from being temporarily affected by the level changing due to an erroneous operation.

The number of flip-flops that are included in the first control unit 30 is not limited to the number of flip-flops shown in the drawing. That is, when the first control unit 30 includes n flip-flops, the first control unit 30 detects that the level of the phase comparing signal phcmp, which is input during (n+1) cycles of the pulse signal pls, is a specific combination, and allows the locking completion signal lock to be enabled.

Figure 5:
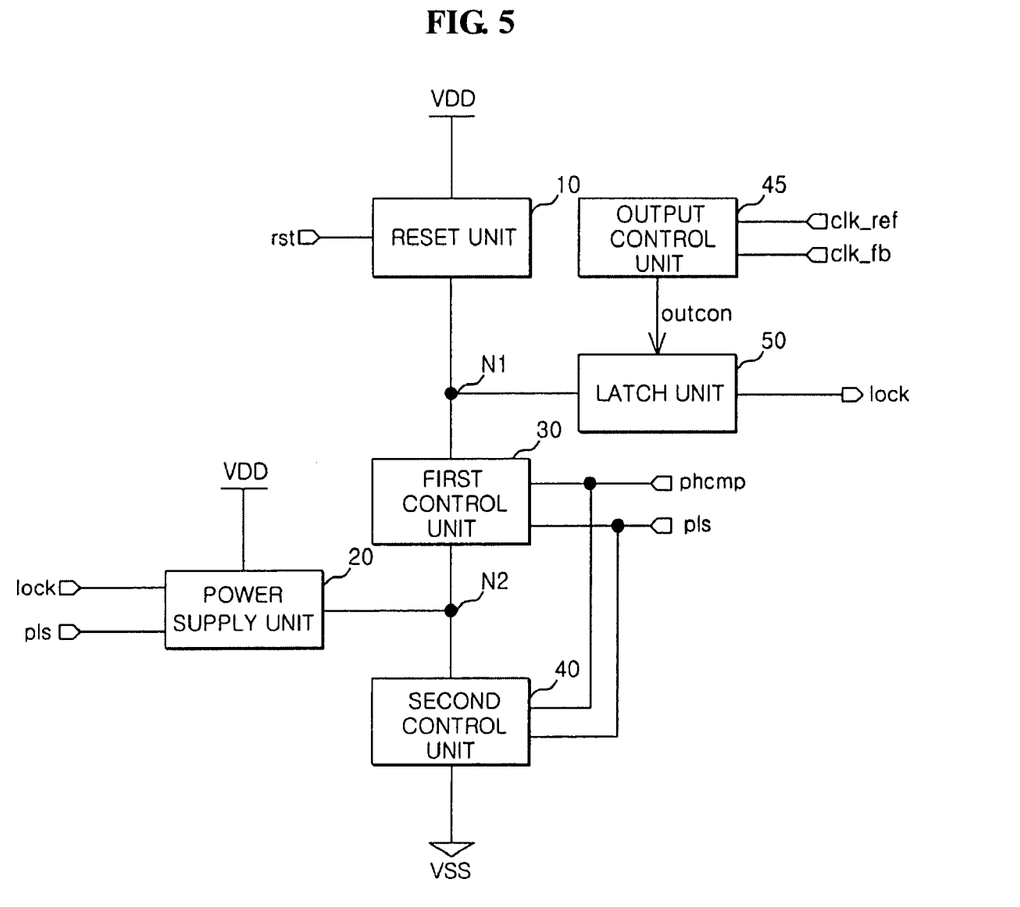
FIG. 5 is a block diagram illustrating a structure of an apparatus for setting an operation mode in a DLL circuit according to a second embodiment of the present invention.

As shown in FIG. 5, an apparatus for setting an operation mode in a DLL circuit according to a second embodiment of the present invention includes a reset unit 10, a power supply unit 20, a first control unit 30, a second control unit 40, an output control unit 45, and a latch unit 50.

The reset unit 10 controls a voltage level of a first node N1 in response to a reset signal rst.

The power supply unit 20 supplies a voltage source to a second node N2 in response to a locking completion signal lock and a pulse signal pls.

The first control unit 30 controls the voltage level of the first node N1 in response to a phase comparing signal phcmp and the pulse signal pls.

The second control unit 40 controls a voltage level of the second node N2 in response to the phase comparing signal phcmp and the pulse signal pls.

The output control unit 45 compares a phase of a reference clock clk_ref with a phase of a feedback clock clk_fb, thereby generating an output control signal outcon.

The latch unit 50 latches a voltage applied at the first node N1 and outputs the locking completion signal lock according to whether the output control signal outcon is enabled or not.

The output control signal outcon is enabled in the case where a period, during which the phases of the reference clock clk_ref and the feedback clock clk_fb are the same, is longer than a period, during which the phases of the reference clock clk_ref and the feedback clock clk_fb are different from each other. The apparatus for setting an operation mode in a DLL circuit performs an original function of generating the locking completion signal lock from the phase comparing signal phcmp when the output control signal outcon is enabled. Meanwhile, and the apparatus for setting an operation mode in a DLL circuit disables the locking completion signal lock when the output control signal outcon is disabled.

That is, when the phases of the reference clock clk_ref and the feedback clock clk_fb are different from each other by a ¼ cycle or more, the output control signal outcon is disabled, and when the phases of the reference clock clk_ref and the feedback clock clk_fb are not different from each other by a ¼ cycle or more, the output control signal outcon is enabled. Accordingly, when an erroneous operation occurs, for example, a phase of the reference clock clk_ref or the feedback clock clk_fb is changed, even though the level of the phase comparing signal phcmp is temporarily changed, the locking completion signal lock is disabled if the phases of the reference clock clk_ref and the feedback clock clk_fb are different from each other by a ¼ cycle or more. As a result, it is possible to prevent an erroneous operation that occurs in the related art.

Figure 6:
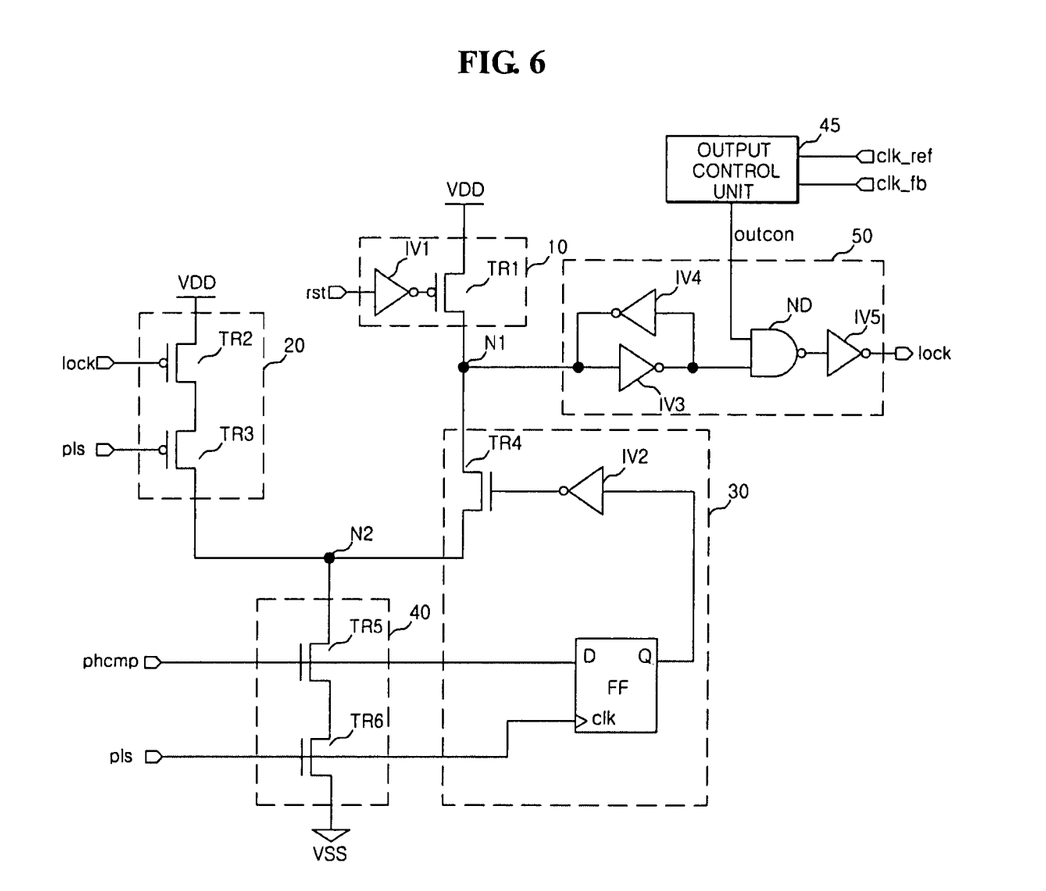
FIG. 6 is a circuit diagram illustrating a detailed structure of the apparatus for setting an operation mode shown in FIG. 5.

FIG. 6 is a diagram illustrating a detailed structure of an apparatus for setting an operation mode shown in FIG. 5.

As shown in FIG. 6, the reset unit 10 includes a first inverter IV1 that receives the reset signal rst, and a first transistor TR1 that has a gate terminal receiving an output signal of the first inverter IV1, a source terminal applied with an external voltage source VDD, and a drain terminal coupled with the first node N1, similar to the first embodiment.

Similar to the first embodiment, the power supply unit 20 includes a second transistor TR2 that has a gate terminal receiving the locking completion signal lock and a source terminal applied with the external voltage source VDD, and a third transistor TR3 that has a gate terminal receiving the pulse signal pls, a source terminal coupled with a drain terminal of the second transistor TR2, and a drain terminal coupled with the second node N2.

The first control unit 30 includes a flip-flop FF, a second inverter IV2, and a fourth transistor TR4.

The flip-flop FF latches the phase comparing signal phcmp according to control of the pulse signal pls.

The second inverter IV2 receives an output signal of the flip-flop FF.

The fourth transistor TR4 includes a gate terminal that receives the output signal of the second inverter IV2, a drain terminal coupled with the first node N1, and a source terminal coupled with the second node N2.

Similar to the first embodiment, the second control unit 40 includes a fifth transistor TR5 and a sixth transistor TR6.

The fifth transistor TR5 includes a gate terminal that receives the phase comparing signal phcmp and a drain terminal coupled with the second node N2.

The sixth transistor TR6 includes a gate terminal that receives the pulse signal pls, a drain terminal coupled with a source terminal of the fifth transistor TR5, and a source terminal coupled with a ground terminal.

Figure 7:
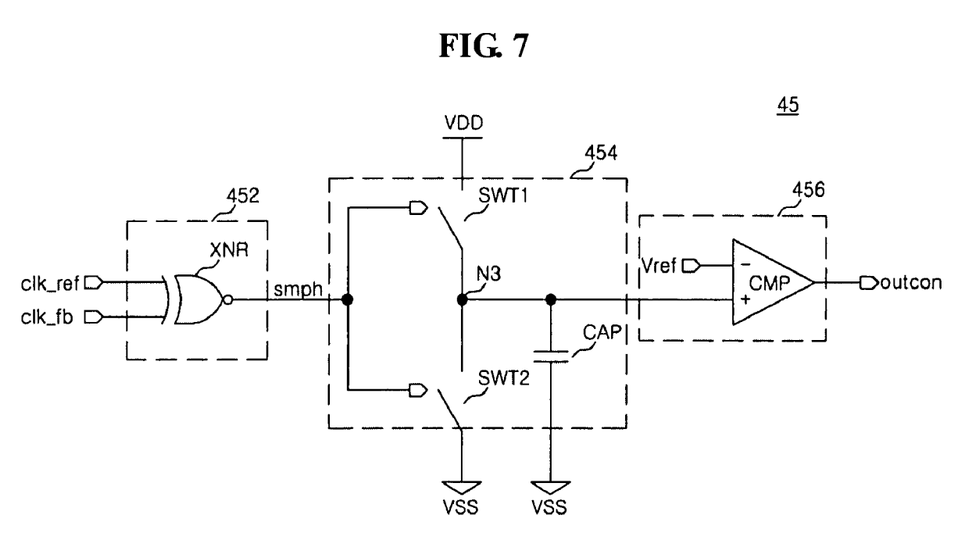
FIG. 7 is a circuit diagram illustrating a detailed structure of an output control unit shown in FIGS. 5 and 6.

At this time, the apparatus for setting an operation mode according to this embodiment can achieve the same effect even when the apparatus uses a structure of the first control unit 30 according to the first embodiment or as in a third embodiment shown in FIG. 7.

The latch unit 50 includes a third inverter IV3 that receives a voltage applied at the first node N1, thereby outputting the locking completion signal lock, a fourth inverter IV4 that forms a latch structure with the third inverter IV3, a NAND gate ND that receives an output signal of the third inverter IV3 and the output control signal outcon, and a fifth inverter IV5 that inverts an output signal of the NAND gate ND, thereby outputting the locking completion signal lock.

The phase comparing signal phcmp is a signal that indicates by levels, information obtained by comparing a delayed feedback clock having passed through one unit delayer and a reference clock by using a phase comparator and determining whether a phase of the reference clock is earlier or later than a phase of the delayed feedback clock. When the phase of the delayed feedback clock is earlier than the phase of the reference clock, the level of the phase comparing signal phcmp becomes a low level, and when the phase of the reference clock is earlier than the phase of the delay feedback clock, the level of the phase comparing signal phcmp becomes a high level. The reason why the feedback clock is delayed and the phases of the feedback clock and the reference clock are then compared with each other is to compare the phases of the feedback clock and the reference clock in advance by one period of the DLL circuit, and to enable, when the phase difference between the two clocks becomes smaller than a delayed amount by one unit delayer, the locking completion signal lock so as to enter a fine locking mode.

The pulse signal pls is generated in the DLL circuit. Generally, the pulse signal pls has a pulse width that corresponds to one cycle of an internal clock, and is implemented in such a manner that it toggles to a high level once for predetermined cycles of the internal clock, for example, fifteen cycles.

When the operation of the DLL circuit starts, the reset signal rst is enabled, and the reset unit 10 makes the voltage level of the first node N1 become a high level.

At this time, the locking completion signal lock becomes a low level. It is assumed that the second node N2 also is at a high level by the power supply unit 20.

If the pulse signal pls is enabled when the phase comparing signal phcmp is at a low level, the phase comparing signal phcmp of the low level is input to the flip-flop FF of the first control unit 30. Then, the output signal of the flip-flop FF is inverted through the second inverter IV2, and turns on the fourth transistor TR4.

In this state, if the level of the phase comparing signal phcmp is changed to a high level and the pulse signal pls is enabled, the fifth transistor TR5 and the sixth transistor TR6 of the second control unit 40 are turned on. Thus, the voltage of the second node N2 becomes a low level. At this time, since the fourth transistor TR4 of the first control unit 30 is turned on, the voltage of the first node N1 also becomes a low level. Then, the output signal of the flip-flop FF becomes a high level and a low-level signal is transmitted to the gate terminal of the fourth transistor TR4, and thus the fourth transistor TR4 is turned off. Accordingly, the voltage of the first node N1 is maintained at a low level, and the output signal of the third inverter IV3 of the latch unit 50 becomes a high level.

At this time, if the output control signal outcon, which is output by the output control unit 45 and transmitted to the NAND gate ND of the latch unit 50 is at a low level, the locking completion signal lock is disabled as a low level regardless of an output signal of the third inverter IV3. Meanwhile, if the output control signal outcon is at a high level, the locking completion signal lock has the same level as the output signal of the third inverter IV3.

As shown in FIG. 7, the output control unit 45 includes a same phase extracting unit 452, a DA converting unit 454, and a comparing unit 456.

The same phase extracting unit 452 extracts a period in which the phases of the reference clock clk_ref and the feedback clock clk_fb are the same, and outputs a same phase signal smph.

The DA converting unit 454 converts the same phase signal smph into an analog signal.

The comparing unit 456 compares a level of an output signal of the DA converting unit 454 with a level of a reference voltage Vref, and outputs the output control signal outcon.

The same phase extracting unit 452 includes an exclusive NOR gate XNR.

The DA converting unit 454 includes a first switch SWT1 that connects, when the same phase signal smph is at a high level, a supply terminal of the external voltage source VDD and a third node N3, a second switch SWT2 that connects, when the same phase signal smph is at a low level, the third node N3 and a ground terminal, and a capacitor CAP arranged between the third node N3 and the ground terminal.

The comparing unit 456 includes a comparator CMP that compares the level of the output signal of the DA converting unit 454 with the level of the reference voltage Vref.

By using this structure, the same phase signal smph becomes a high level during a period, during which the phase of the reference clock clk_ref and the phase of the feedback clock clk_fb are the same, and becomes a low level during a period during which the phase of the reference clock clk_ref and the phase of the feedback clock clk_fb are different from each other. If the high-level period of the same phase signal smph is longer than the low-level period of the same phase signal smph, the output signal of the DA converting unit 454 becomes a low level. Meanwhile, if the low-level period of the same phase signal smph is longer than the high-level period, the output signal of the DA converting unit 454 becomes a high level. Then, the comparing unit 456 compares a level of an output signal of the DA converting unit 454 and a level of the reference voltage Vref. At this time, when the level of the output signal of the DA converting unit 454 is higher than the level of the reference voltage Vref, the comparing unit 456 disables the output control signal outcon as a low level, and when the level of the output signal of the DA converting unit 454 is lower than the level of the reference voltage Vref, the comparing unit 456 enables the output control signal outcon as a high level.

That is, the output control signal outcon reflects a result that is obtained by detecting the phase difference between the reference clock clk_ref and the feedback clock clk_fb. If the phase difference between the reference clock clk_ref and the feedback clock clk_fb is in a range of a cycle of ¼ to ¾, the output control signal outcon is disabled, but is enabled in the other cases.

When the output control signal outcon having the above-described feature is enabled, the voltage applied at the first node N1 of the apparatus for setting an operation mode is inverted, thereby being output as the locking completion signal lock. That is, after the phases of the reference clock clk_ref and the feedback clock clk_fb become nearly the same, the output control signal outcon is enabled. At this time, the locking completion signal lock can be enabled.

Figure 8A:
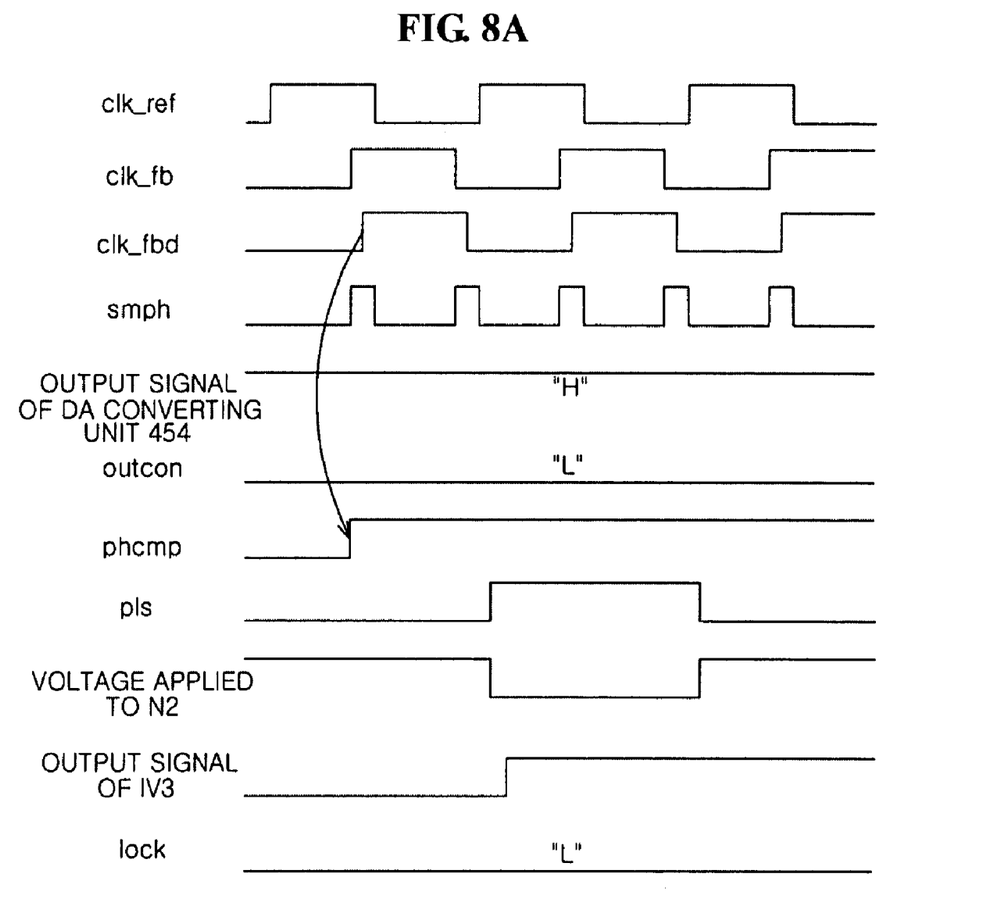
FIGS. 8A, 8B, and 8C are timing diagrams illustrating the operation of an apparatus for setting an operation mode in a DLL circuit according to the second embodiment of the present invention.
Figure 8B:
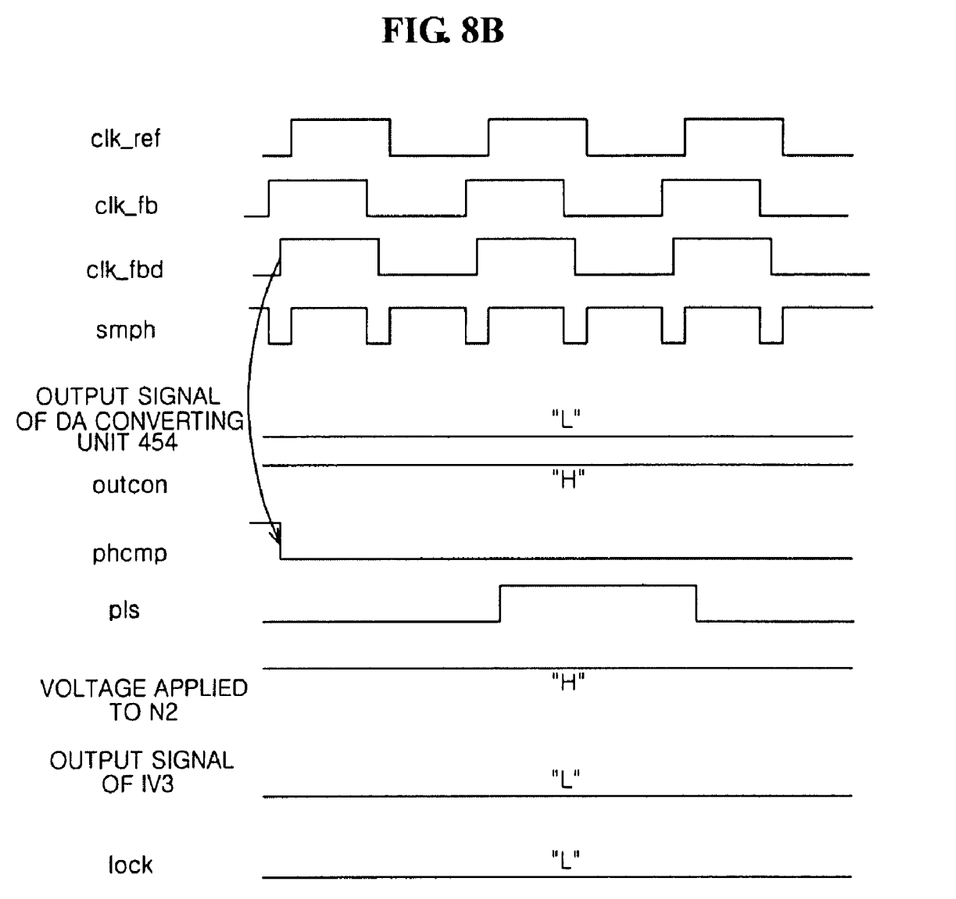
Figure 8C:
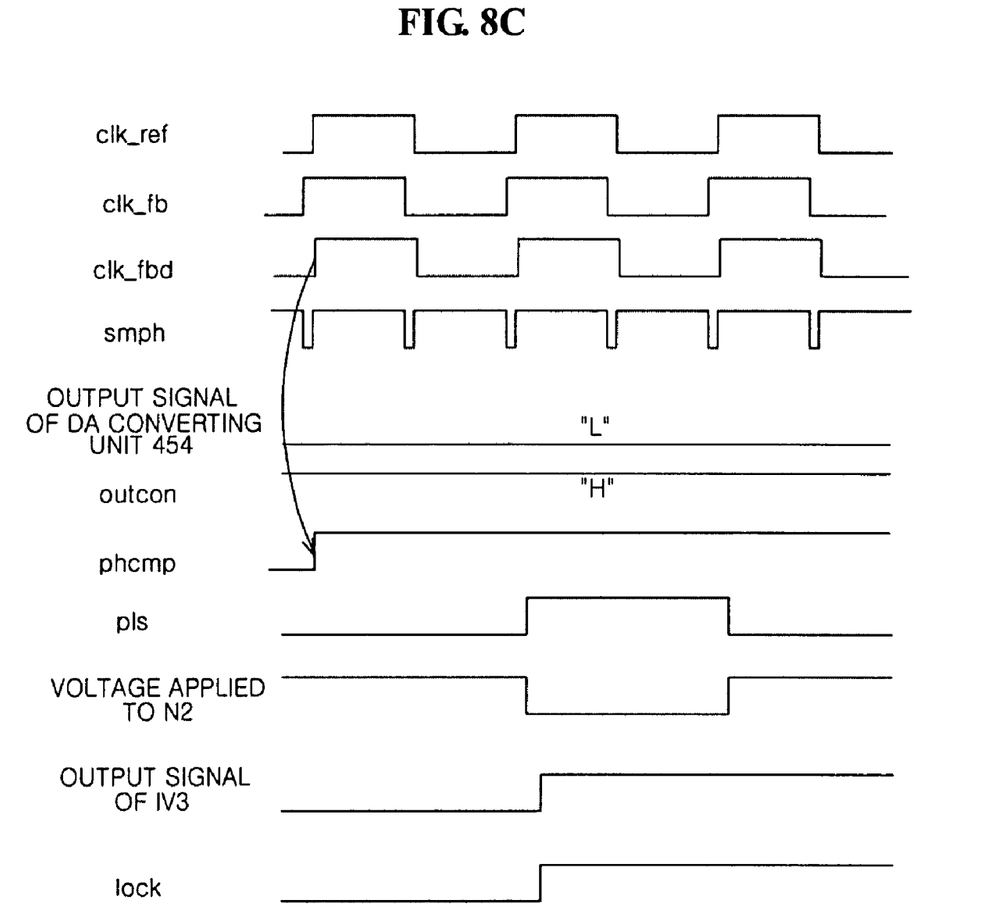
Figure 9:
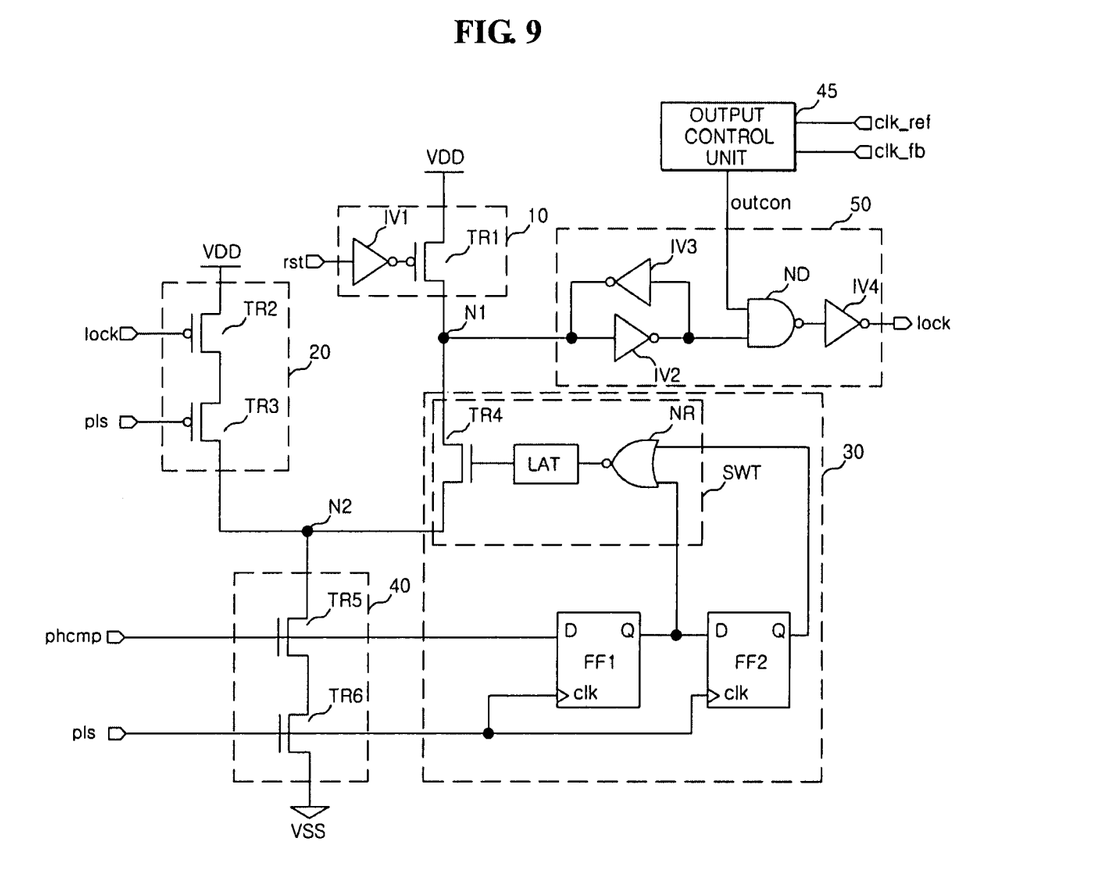
FIG. 9 is a circuit diagram illustrating a structure of an apparatus for setting an operation mode in a DLL circuit according to a third embodiment of the present invention.

This operation can be understood in more detail with reference to FIGS. 8A to 8C. Referring to FIG. 8A, the phase of the reference clock clk_ref is earlier than the phase of the feedback clock clk_fb by a ¼ cycle or more. As a result of comparing the phase of the delayed feedback clock clk_fbd and the phase of the reference clock clk_ref, the phase comparing signal phcmp is changed from the low level to the high level. At this time, the high-level period of the same phase signal smph is shorter than the low-level period. Accordingly, the output signal of the DA converting unit 454 becomes a high level, and the output control signal outcon is disabled as the low level. During an enabled period of the pulse signal pls, the voltage of the second node N2 becomes a low level, and thus the output signal of the third inverter IV3 becomes a high level. However, since the output control signal outcon is disabled, the locking completion signal lock is maintained in a disabled state.

Referring to FIG. 8B, the phase of the feedback clock clk_fb is earlier than the phase of the reference clock clk_ref. At this time, the phase of the delayed feedback clock clk_fbd is also earlier than the phase of the reference clock clk_ref. Accordingly, the phase comparing signal phcmp becomes a low level. The high-level period of the same phase signal smph becomes longer than the low-level period. Accordingly, the output signal of the DA converting unit 454 becomes a low level, and the output control signal outcon is enabled as a high level. During an enabled period of the pulse signal pls, the voltage of the second node N2 becomes a high level, and thus the output signal of the third inverter IV3 becomes a low level. Therefore, the locking completion signal lock is maintained in a disabled state.

Referring to FIG. 8C, the phase of the feedback clock clk_fb is earlier than the phase of the reference clock clk_ref. At this time, the phase of the reference clock clk_ref is earlier than the phase of the delayed feedback clock clk_fbd. As a result, the phase comparing signal phcmp is changed from a low level to a high level. At this time, the high-level period of the same phase signal smph becomes longer than the low-level period. Accordingly, the output signal of the DA converting unit 454 becomes a low level, and the output control signal outcon is disabled at a high level. During an enabled period of the pulse signal pls, the voltage of the second node N2 becomes a low level, and thus the output signal of the third inverter IV3 becomes a high level. At this time, since the output control signal outcon is enabled, the locking completion signal lock is enabled.

That is, if the phase of the reference clock clk_ref and the phase of the feedback clock clk_fb are different from each other by a ¼ cycle, the locking completion signal lock is disabled. As a result, even when a phase of a reference clock clk_ref or a feedback clock clk_fb is changed and the level of the phase comparing signal phcmp is temporarily shifted, a delay locking operation of the DLL circuit is not completed at an undesired timing. Accordingly, it is possible to prevent an erroneous operation in which the delay locking operation of the DLL circuit is completed outside a timing set in advance, which improves stability of a semiconductor integrated circuit using a DLL circuit.

The apparatus for setting an operation mode in the DLL circuit according to on the embodiment of the present invention reduces an erroneous operation in semiconductor integrated circuits that use clocks that are not constant for each period, which applies a stable delay locking operation.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

As described above, according to the apparatus and method of setting an operation mode in a DLL circuit according to an embodiment of the present invention, when the level of the phase comparing signal is changed after being maintained during two periods or more, only the locking completion signal of the DLL circuit is enabled, which reduces an erroneous operation due to the variation in a pulse width of the reference clock or the feedback clock.

Further, according to the apparatus and method of setting an operation mode in a DLL circuit according to an embodiment of the present invention, the phases of the reference clock and the feedback clock become nearly the same, only the locking completion signal is enabled, which improves stability of the DLL circuit.

What is claimed is:

1. An apparatus for setting an operation mode in a DLL (Delay Locked Loop) circuit, the apparatus comprising:
   a reset unit configured to control a voltage level of a first node in response to a reset signal;
   a power supply unit configured to supply a voltage source to a second node in response to a locking completion signal and a pulse signal;
   a first control unit configured to determine whether a phase comparing signal having the same voltage level is inputted continuously at least three times and to control the voltage level of the first node according to the determined result;
   a second control unit configured to control a voltage level of the second node in response to the phase comparing signal and the pulse signal; and
   a latch unit configured to latch the voltage applied at the first node, thereby outputting the locking completion signal.

2. The apparatus according to claim 1,
   wherein, when a level of the phase comparing signal is maintained at a first level during two or more cycles of the pulse signal and then is changed to a second level, the first control unit controls the voltage level of the first node to be the first level.

3. The apparatus according to claim 2,
   wherein the power supply unit is configured to supply a voltage source to the second node when the locking completion signal is disabled and the pulse signal is at a first level.

4. The apparatus according to claim 2,
   wherein the second control unit is configured to control the voltage level of the second node to be a first level, when the phase comparing signal and the pulse signal are at a second level.

5. The apparatus according to claim 1,
   wherein the reset unit is configured to supply a voltage source to the first node, when the reset signal is enabled.

6. The apparatus according to claim 1,
   wherein the reset unit comprises:
   an inverter configured to invert the reset signal to provide an output signal; and
   a transistor configured to have a gate terminal receiving the output signal of the inverter, a source terminal applied with an external voltage source, and a drain terminal coupled with the first node.

7. The apparatus according to claim 1,
   wherein the power supply unit comprises:
   a first transistor configured to have a drain terminal, a gate terminal receiving the locking completion signal, and a source terminal applied with the external voltage source; and
   a second transistor configured to have a gate terminal receiving the pulse signal, a source terminal coupled with the drain terminal of the first transistor, and a drain terminal coupled with the second node.

8. The apparatus according to claim 1,
wherein the first control unit comprises:
a first flip-flop configured to latch the phase comparing signal according to control of the pulse signal to provide an output signal; and
a second flip-flop configured to latch the output signal of the first flip-flop according to the control of the pulse signal to provide an output signal; and
a switch configured to connect, when the output signal of the first flip-flop and the output signal of the second flip-flop are at the first level, the first node and the second node.

9. The apparatus according to claim 1,
wherein the second control unit comprises:
a first transistor configured to have a source terminal, a gate terminal receiving the phase comparing signal, and a drain terminal coupled with the second node; and
a second transistor configured to have a gate terminal receiving the pulse signal, a drain terminal coupled with the source terminal of the first transistor, and a source terminal coupled with a ground.

10. The apparatus according to claim 1,
wherein the latch unit is configured to invert the voltage of the first node, thereby outputting the locking completion signal, and to store the locking completion signal.

11. The apparatus according to claim 1,
wherein the latch unit comprises:
a first inverter configured to receive the voltage applied at the first node, thereby outputting the locking completion signal; and
a second inverter configured to form a latch structure with the first inverter.

12. The apparatus according to claim 1, further comprising:
an output control unit configured to compare phases of a reference clock and a feedback clock, thereby generating an output control signal,
wherein the latch unit generates, when the output control signal is enabled, the locking completion signal according to the voltage applied at the first node.

13. An apparatus for setting an operation mode in a DLL (Delay Locked Loop) circuit, the apparatus comprising:
a reset unit configured to control a voltage level of a first node in response to a reset signal;
a power supply unit configured to supply a voltage source to a second node in response to a locking completion signal and a pulse signal;
a first control unit configured to include a first flip-flop latching a phase comparing signal according to control of the pulse signal to provide an output signal and a second flip-flop latching the output signal of the first flip-flop according to the control of the pulse signal, and to change, when a logic value of levels of the phase comparing signal input to the first flip-flop is a specific combination, the voltage level of the first node;
a second control unit configured to control the voltage level of the second node in response to the phase comparing signal and the pulse signal; and
a latch unit configured to latch the voltage level at the first node, thereby outputting the locking completion signal.

14. The apparatus according to claim 13, further comprising:
an output control unit configured to compare phases of a reference clock and a feedback clock, thereby generating an output control signal,
wherein the latch unit generates, when the output control signal is enabled, the locking completion signal according to the voltage level at the first node.

15. An apparatus for setting an operation mode in a DLL (Delay Locked Loop) circuit, the apparatus comprising:
a reset unit configured to control a voltage level of a first node in response to a reset signal;
a power supply unit configured to supply a voltage source to a second node in response to a locking completion signal and a pulse signal;
a first control unit configured to controls the voltage of the first node in response to a phase comparing signal and the pulse signal;
a second control unit configured to control the voltage level of a second node in response to the phase comparing signal and the pulse signal;
an output control unit configured to compare a phase of a reference clock and a phase of a feedback clock, thereby generating an output control signal; and
a latch unit configured to latch the voltage at the first node, thereby outputting the locking completion signal according to whether the output control signal is enabled or not.

16. The apparatus according to claim 15,
wherein the output control unit is configured to enable the output control signal when a period, during which the phases of the reference clock and the feedback clock are the same, is longer than a period, during which the phases thereof are different from each other.

17. The apparatus according to claim 15,
wherein the latch unit is configured to disable the locking completion signal when the output control signal is disabled, and to enable or disable the locking completion signal according to the voltage level of the first node when the output control signal is enabled.

18. The apparatus according to claim 15,
wherein the reset unit is configured to supply a voltage source to the first node when the reset signal is enabled.

19. The apparatus according to claim 15,
wherein the power supply unit is configured to supply the voltage source to the second node when the locking completion signal is disabled and the pulse signal does not toggle.

20. The apparatus according to claim 15,
wherein the first control unit is configured to connect the first node and the second node according to control of the phase comparing signal that is transmitted when the phase of the feedback clock is earlier than the phase of the reference clock.

21. The apparatus according to claim 15,
wherein the second control unit is configured to synchronize the voltage level of the second node with a ground level by the phase comparing signal transmitted when the phase of the reference clock is earlier than the phase of the feedback clock and the pulse signal at the time of toggling.

22. The apparatus according to claim 15,
wherein the output control unit comprises:
a same phase extracting unit configured to extract a period, during which the phases of the reference clock and the feedback clock are the same, thereby outputting a same phase signal;
a DA converting unit configured to convert the same phase signal into an analog signal; and
a comparing unit configured to compare the analog signal of the DA converting unit with a reference voltage, thereby outputting the output control signal.

23. The apparatus according to claim 22,
wherein the same phase extracting unit is configured to generate the same phase signal that has a first level during a period which the phases of the reference clock and the feedback clock are the same, and that has a second level that is obtained by inverting the first level during a period which the phases of the reference clock and the feedback clock are different from each other.

24. The apparatus according to claim 23,
wherein the DA converting unit is configured to output the analog signal that has the first level when a period, during which the level of the same phase signal is at the first level, is longer than a period, during which the level of the same phase is at the second level, and has the second level when the period, during which the level of the same phase signal is at the first level, is shorter than the period, during which the level of the same phase signal is at the second level.

25. The apparatus according to claim 24,
wherein the DA converting unit comprises:
a first switch configured to connect, when the same phase signal is at the first level, a supply terminal of an external voltage source and a third node;
a second switch configured to connect, when the same phase signal is at the second level, the third node and a ground terminal; and
a capacitor between the third node and the ground terminal.

26. The apparatus according to claim 24,
wherein the comparing unit is configured to enable the output control signal when the output signal of the DA converting unit is at the first level, and to disable the output control signal when the output signal of the DA converting unit is at the second level.

27. A method of setting an operation mode in a DLL (Delay Locked Loop) circuit, the method comprising:
controlling a voltage level of a voltage applying node in response to a phase comparing signal, a pulse signal, and a locking completion signal;
comparing a phase of a reference clock and a phase of a feedback clock, thereby generating an output control signal; and
outputting a voltage applied at the voltage applying node as the locking completion signal according to control of the output control signal.

28. The method according to claim 27,
wherein the generating the output control signal comprises enabling the output control signal when a period, during which the phases of the reference clock and the feedback clock are the same, is longer than a period, during which the phases of the reference clock and the feedback clock are different from each other, and to disable the output control signal when the period, during which the phases of the reference clock and the feedback clock are the same, is shorter than the period, during which the phases of the reference clock and the feedback clock are different from each other.

29. The method according to claim 27,
wherein the generating the output control signal comprises:
extracting a period, during which the phases of the reference clock and the feedback clock are the same, thereby outputting a same phase signal;
converting the same phase signal into an analog signal; and
comparing a level of the analog signal with a level of a reference voltage, thereby outputting the output control signal.

30. The method according to claim 29,
wherein the outputting the same phase signal comprises generating the same phase signal that has a first level during a period which the phases of the reference clock and the feedback clock are the same, and has a second level that is obtained by inverting the first level during a period which the phases of the reference clock and the feedback clock are different from each other.

31. The method according to claim 30,
wherein the converting the same phase signal into the analog signal comprises outputting the analog signal that has the first level when a period, during which the same phase signal is at the first level, is longer than a period, during which the same phase signal is at the second level, and has the second level when the period, during which the same phase signal is at the first level, is shorter than the period, during which the same phase signal is at the second level.

32. The method according to claim 29,
wherein the outputting of the output control signal comprises enabling the output control signal, when the level of the analog signal is higher than the level of the reference voltage, and to disable the output control signal, when the level of the analog signal is lower than the level of the reference voltage.

* * * * *